(12) United States Patent
Lee et al.

(10) Patent No.: US 12,224,361 B2
(45) Date of Patent: Feb. 11, 2025

(54) SOLAR CELL MODULE HAVING UPCONVERSION NANO-PARTICLES AND METHOD OF MANUFACTURING THE SOLAR CELL MODULE

(71) Applicant: RESEARCH & BUSINESS FOUNDATION SUNGKYUNKWAN UNIVERSITY, Suwon-si (KR)

(72) Inventors: Jae Hyung Lee, Hwaseong-si (KR); Hongsub Jee, Seoul (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 0 days.

(21) Appl. No.: 17/580,984

(22) Filed: Jan. 21, 2022

(65) Prior Publication Data

US 2022/0238734 A1 Jul. 28, 2022

(30) Foreign Application Priority Data

Jan. 26, 2021 (KR) .......................... 10-2021-0010674

(51) Int. Cl.
*H01L 31/0216* (2014.01)
*H01L 31/02* (2006.01)
*H02J 7/35* (2006.01)

(52) U.S. Cl.
CPC .. *H01L 31/02168* (2013.01); *H01L 31/02021* (2013.01); *H02J 7/35* (2013.01)

(58) Field of Classification Search
CPC ......... H01L 31/02168; H01L 31/02021; H01L 31/048; H01L 31/055; H01L 31/0203; H01L 31/02327; H01L 31/0328; H01L 31/035227; H01L 31/042; H01L 31/18; H01L 2031/0344; H02J 7/35; C09K 11/7773; Y02E 10/52; Y02E 10/50
See application file for complete search history.

(56) References Cited

U.S. PATENT DOCUMENTS

| | | | | |
|---|---|---|---|---|
| 2011/0297226 A1* | 12/2011 | Tsai | .................. | H01L 31/03682 252/301.4 R |
| 2012/0204951 A1* | 8/2012 | Wang | .................... | H01L 31/055 438/57 |
| 2013/0139868 A1* | 6/2013 | Zhang | ................. | H01L 31/0481 257/E31.118 |

FOREIGN PATENT DOCUMENTS

| | | |
|---|---|---|
| JP | 2015-195397 A | 11/2015 |
| KR | 10-1575733 B1 | 12/2015 |

* cited by examiner

*Primary Examiner* — Angelo Trivisonno
(74) *Attorney, Agent, or Firm* — NSIP Law

(57) ABSTRACT

Disclosed is a solar cell module. The module includes a solar cell including a plurality of unit battery cells electrically connected to each other via internal connection electrodes; an upper cover disposed on a front face of the solar cell; a light-conversion coating layer coated on an inner face of the upper cover, wherein the light-conversion coating layer includes upconversion nano-particles for absorbing near-infrared rays and emitting light having a wavelength in a visible region; a lower cover disposed on a rear face of the solar cell; a first filling material layer formed between the solar cell and the light-conversion coating layer; and a second filling material layer formed between the solar cell and the lower cover.

10 Claims, 3 Drawing Sheets

[Figure 1]
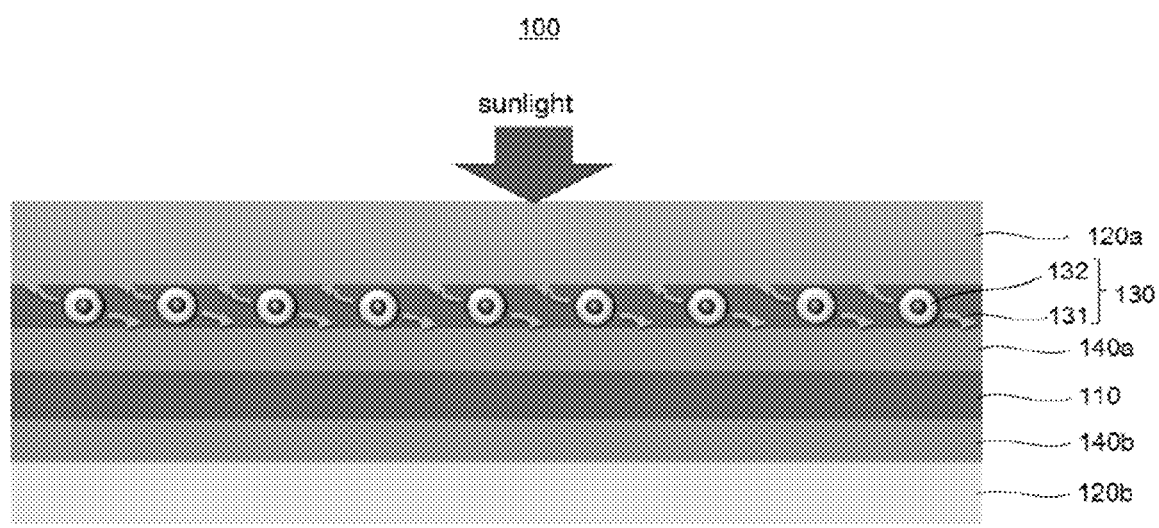

[Figure 2]
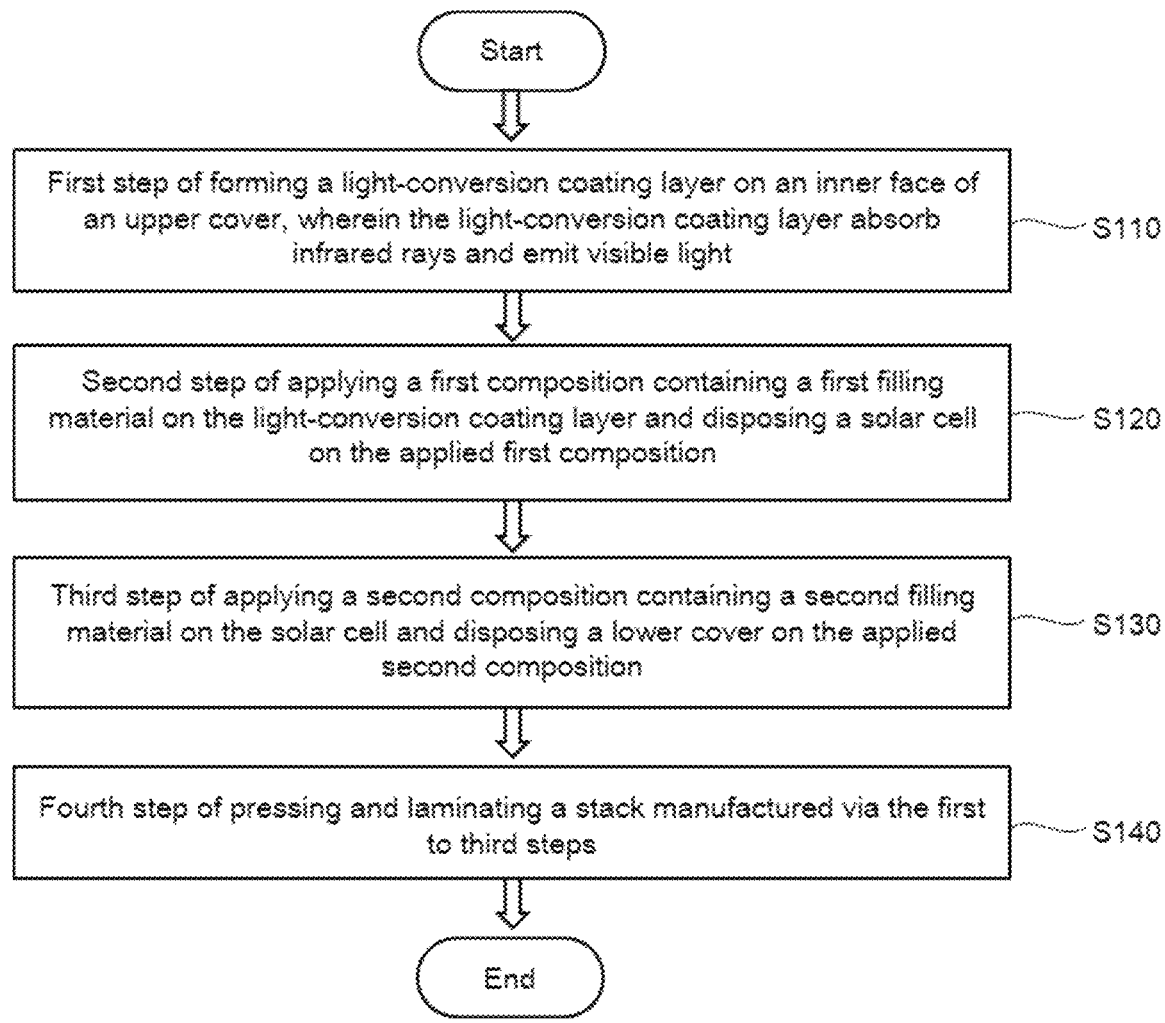

[Figure 3]
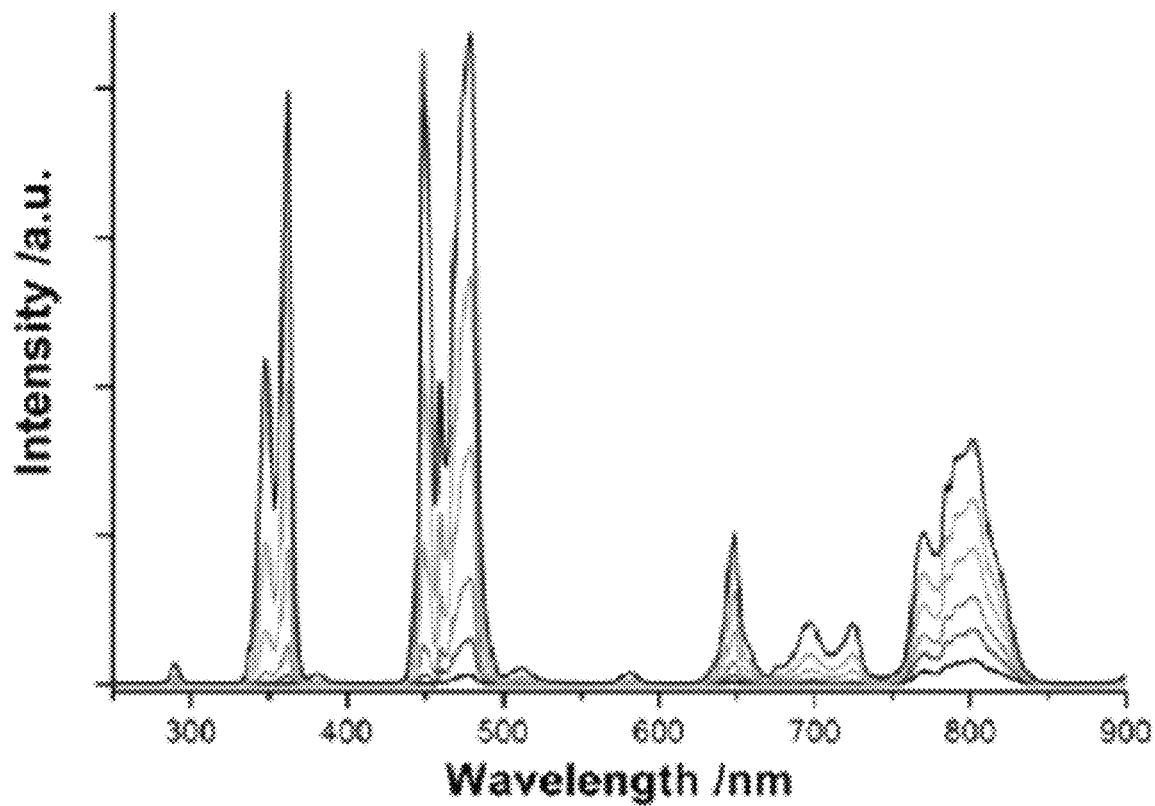

SOLAR CELL MODULE HAVING UPCONVERSION NANO-PARTICLES AND METHOD OF MANUFACTURING THE SOLAR CELL MODULE

TECHNICAL FIELD

The present disclosure relates to a solar cell module for generating electric energy using sunlight and a method for manufacturing the same.

BACKGROUND ART OF THE INVENTION

Recently, due to environmental problems and depletion of coal resources, a technology for a solar cell (or solar panel) that converts light energy into electric energy has been rapidly developed. These solar cells are generally commercialized in a form of a module, and technology development for increasing efficiency and output of the solar cell module is still in progress.

In general, silicon solar cells are mainly used to manufacture the solar cell module. However, since the efficiency of the silicon solar cell has already approached the theoretical maximum efficiency of about 29%, a method for improving the efficiency of the silicon solar cell itself is evaluated to be very limited.

Therefore, it is necessary to develop a technology capable of improving the efficiency and the output of the solar cell module in addition to efficiency improvement technology of the solar cell itself.

DESCRIPTION

Challenge to Solve

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

A purpose of the present disclosure is to provide a solar cell module that may have a coating layer including upconversion nano-particles for converting near-infrared wavelength light into visible light wavelength light on one face of a substrate, thereby improving light conversion efficiency and output thereof.

Another purpose of the present disclosure is to provide a method for manufacturing the solar cell module.

Solution to the Problem

Purposes in accordance with the present disclosure are not limited to the above-mentioned purpose. Other purposes and advantages in accordance with the present disclosure as not mentioned above may be understood from following descriptions and more clearly understood from embodiments in accordance with the present disclosure. Further, it will be readily appreciated that the purposes and advantages in accordance with the present disclosure may be realized by features and combinations thereof as disclosed in the claims.

A first aspect of the present disclosure provides a solar cell module comprising: a solar cell including a plurality of unit battery cells electrically connected to each other via internal connection electrodes; an upper cover disposed on a front face of the solar cell; a light-conversion coating layer coated on an inner face of the upper cover, wherein the light-conversion coating layer includes upconversion nano-particles for absorbing near-infrared rays and emitting light having a wavelength in a visible region; a lower cover disposed on a rear face of the solar cell; a first filling material layer formed between the solar cell and the light-conversion coating layer; and a second filling material layer formed between the solar cell and the lower cover.

In one implementation of the solar cell module, the light-conversion coating includes a transparent matrix layer and the upconversion nano-particles dispersed inside the transparent matrix layer.

In one implementation of the solar cell module, each of the upconversion nano-particles includes $NaYF_4$ doped with ytterbium (Yb) and erbium (Er).

In one implementation of the solar cell module, the upconversion nano-particles absorb the near-infrared rays and emit visible light of a wavelength in a range of 350 to 500 nm.

In one implementation of the solar cell module, the light-conversion coating layer includes the upconversion nano-particles and a material of the transparent matrix layer in a mass ratio in a range of 1:5 to 1:20.

In one implementation of the solar cell module, the light-conversion coating layer has a thickness in a range of 500 μm to 3 mm.

A second aspect of the present disclosure provides a method for manufacturing a solar cell module, the method comprising: a first step of forming a light-conversion coating layer on an inner face of an upper cover, wherein the light-conversion coating layer absorb infrared rays and emit visible light; a second step of applying a first composition containing a first filling material on the light-conversion coating layer and disposing a solar cell on the applied first composition; a third step of applying a second composition containing a second filling material on the solar cell and disposing a lower cover on the applied second composition; and a fourth step of pressing and laminating a stack manufactured via the first to third steps, wherein the stack includes the upper cover, the light-conversion coating layer, the first composition, the solar cell, the second composition, and the lower cover.

In one implementation of the method, the forming of the light-conversion coating layer includes applying a mixed composition of a transparent matrix material and upconversion nano-particles on the inner face of the upper cover using a blading scheme, and crosslinking a photoresist, wherein the transparent matrix material includes the photoresist.

In one implementation of the method, the mixed composition further includes cyclopentanone, wherein a solid content of the mixed composition is in a range of 50 to 80% by weight.

In one implementation of the method, each of the first and second filling materials includes EVA (ethylene-vinyl acetate copolymer), silicone resin or PVB (polyvinyl butyral).

A third aspect of the present disclosure provides a front cover for a solar cell module, the front cover comprising: a glass substrate; a transparent matrix layer formed on one face of the glass substrate; and upconversion nano-particles dispersed in the transparent matrix layer.

In one implementation of the front cover, each of the upconversion nano-particles includes $NaYF_4$ doped with ytterbium (Yb) and erbium (Er), wherein the upconversion nano-particles absorb the near-infrared rays and emit visible light of a wavelength in a range of 350 to 500 nm.

Effects of the Invention

According to the solar cell module and the method for manufacturing the same according to the present disclosure, the coating layer in which the upconversion nano-particles capable of converting near-infrared light into visible light are dispersed is disposed on an inner face of a glass substrate, such that overall photoelectric efficiency of the solar cell module may be improved, and as a result, the output thereof may be improved.

In addition to the effects as described above, specific effects in accordance with the present disclosure will be described together with following detailed descriptions for carrying out the disclosure.

BRIEF DESCRIPTION OF DRAWINGS

FIG. 1 is a cross-sectional view for illustrating a solar cell module according to an embodiment of the present disclosure.

FIG. 2 is a flowchart for illustrating a method of manufacturing a solar cell module according to an embodiment of the present disclosure.

FIG. 3 is a graph of an intensity based on a wavelength of light emission after irradiating a near-infrared wavelength to upconversion nano-particles having a $\beta$-NaYbF$_4$:Tm$^{3+}$ composition.

DETAILED DESCRIPTION FOR INVENTION'S IMPLEMENT

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entirety of list of elements and may not modify the individual elements of the list. When referring to "C to D", this means C inclusive to D inclusive unless otherwise specified.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view for illustrating a solar cell module according to an embodiment of the present disclosure.

Referring to FIG. 1, a solar cell module 100 according to an embodiment of the present disclosure includes a solar cell 110, an upper cover 120a, a lower cover 120b, a light-conversion coating layer 130, a first filling material layer 140a and a second filling material layer 140b.

The solar cell 110 may include a plurality of unit battery cells electrically connected to each other via internal connection electrodes. A type of each of the unit battery cells is not particularly limited. In one embodiment, the battery cell may include at least one selected from a silicon solar cell, a compound semiconductor solar cell, an organic solar cell, a dye-sensitized solar cell, and the like. For example, the solar cell 110 may include a plurality of silicon solar cells.

The upper cover 120a and the lower cover 120b may be respectively disposed on front and rear faces of the solar cell 110 to protect the solar cell 110 from external impact or contaminants.

The upper cover 120a may be disposed on the front face of the solar cell 110 to which sunlight is incident, and may be made of a transparent material having excellent mechanical strength. For example, the upper cover 120a may be made of glass having a transmittance of about 80% or greater, or a polymer material such as acryl, polycarbonate, or fluorine resin.

The lower cover 120b may be disposed on the rear face of the solar cell 110, and may be made of a polymer material, glass, or the like. For example, the lower cover 120b may be made of a fluorine-based polymer, for example, PVF (polyvinyl fluoride). In another example, the lower cover 120b may include a reflective film that reflects light passing through the solar cell 110 back toward the solar cell 110.

The light-conversion coating layer 130 may be formed on an inner face of the upper cover 120a. The light-conversion coating layer 130 may absorb near-infrared rays having a wavelength of about 800 to 1200 nm and convert the same into light having a wavelength in a visible ray region. The solar cell 110 generally has high photoelectric conversion efficiency of light in the visible region, but has low photoelectric conversion efficiency of ultraviolet rays having a wavelength of about 300 nm or smaller or infrared rays having a wavelength of about 800 nm or greater. In accordance with the present disclosure, the light-conversion coating layer 130 may be formed on the inner face of the upper cover 120a, thereby converting the near-infrared rays having a wavelength of about 800 to 1200 nm among incident sunlight beams into the visible rays and providing the visible rays to the solar cell 110. As a result, the photoelectric conversion efficiency of an entirety of the solar cell module 100 according to the present disclosure may be improved, and as a result, the output power thereof may be improved. In addition, when using the light-conversion coating layer 130 for converting the infrared rays into visible rays, decrease in a lifetime of the solar cell 110 due to increase in an internal temperature due to absorption of the infrared rays may be reduced.

In an embodiment, the light-conversion coating layer 130 may include a transparent matrix layer 131 and upconversion nano-particles 132 dispersed in the transparent matrix layer 131.

The transparent matrix layer 131 may be made of an optically transparent material. For example, the transparent matrix layer 131 may be made of an organic material such as a photoresist.

The upconversion nano-particles 132 may absorb near-infrared rays having a wavelength of about 800 to 1200 nm and emit visible light having a wavelength greater than about 300 nm and smaller than 800 nm, for example, visible light having a wavelength of about 350 to 500 nm. In an embodiment, the upconversion nano-particles 132 may be made of $NaYF_4$ doped with ytterbium (Yb) and erbium (Er).

In an embodiment, the light-conversion coating layer 130 may include the upconversion nano-particles and the transparent matrix material in a mass ratio of about 1:20 to 1:5. When the mass ratio of the upconversion nano-particles to the transparent matrix material is greater than 1:5, a content of the upconversion nano-particles is too high, so that processability of a mixed material of the upconversion nano-particles and the transparent matrix material may be reduced. Further, an amount of the visible light incident to the solar cell 110 among the sunlight beams via the upconversion nano-particles may be reduced. When the mass ratio of the upconversion nano-particles and to the transparent matrix material is less than 1:20, the content of the upconversion nano-particles is too low, such that the efficiency of converting the infrared light into the visible light is deteriorated. According to experimental examples of the present disclosure, when the mixing ratio of the upconversion nano-particles to the photoresist was changed from 1:10 to 1:5, a maximum output power (Pmax) greatly increased from 0.767% to 0.973%. In consideration of the above fact, a mass ratio of the upconversion nano-particles comprising $NaYF_4$, Yb and Er to a material including a photoresist of the transparent matrix layer is preferably greater than 1:10 and less than 1.5.

In one example, the light-conversion coating layer 130 may further include cyclopentanone. A solid content of a mixed composition constituting the light-conversion coating layer 130 may be adjusted based on the cyclopentanone. In one embodiment, the solid content of the mixed composition constituting the light-conversion coating layer 130 may be in a range of about 50 to 80 wt %.

In an embodiment, the light-conversion coating layer 130 may be formed by applying the mixed composition on the inner face of the upper cover 120a using a blading method and then crosslinking the photoresist. For example, the mixed composition may be applied on the inner face of the upper cover 120a. Then, the method may blade the mixed composition using a metal blade at a speed of about 0.5 cm/sec to 2 cm/sec to form a coating film. Then, the coating film may be crosslinked. Thus, the light-conversion coating layer 130 may be formed. In one example, the light-conversion coating layer 130 may be formed to have a thickness of about 500 µm to 3 mm.

The first filling material layer 140a may be formed between the solar cell 110 and the light-conversion coating layer 130, and the second filling material layer 140b may be disposed between the solar cell 110 and the lower cover 120b. The first and second filling material layers 140a and 140b may be formed to respectively cover the front and rear faces of the solar cell 110 and may fill spaces between the unit battery cells and the connection electrodes, and may prevent deformation and damage of the unit battery cells and the connection electrodes. Each of the first and second filling material layers 140a and 140b may be made of an optically transparent and electrically insulating material. For example, each of the first and second filling material layers 140a and 140b may be made of EVA (ethylene-vinyl acetate copolymer), silicone resin, PVB (polyvinyl butyral), or the like.

FIG. 2 is a flowchart for illustrating a method of manufacturing a solar cell module according to an embodiment of the present disclosure.

Referring to FIG. 2 together with FIG. 1, the method of manufacturing the solar cell module according to an embodiment of the present disclosure includes a first step S110 of forming the light-conversion coating layer 130 on one face of the upper cover 120a; a second step S120 of applying a first composition containing a first filling material on the light-conversion coating layer 130 and disposing a solar cell on the applied first composition; a third step S130 of applying a second composition containing a second filling material on the solar cell 110 and disposing the lower cover 120b on the applied second composition; and a fourth step S140 of pressing and laminating a multilayer structure manufactured through the first to third steps.

In the first step S110, the mixed composition of the transparent matrix material and the upconversion nano-particles may be applied on the inner face of the upper cover 120a using a blading method, and then pre-baked. Then, UV may be applied thereto to cross-link the photoresist. The light-conversion coating layer 130 may be formed.

In the second step S120, the first composition containing a filling material selected from EVA (ethylene-vinyl acetate copolymer), silicone resin, PVB (polyvinyl butyral), etc. may be applied on the light-conversion coating layer 130, and the solar cell 110 may be placed thereon. In one example, the solar cell 110 may include the plurality of unit battery cells electrically connected to each other via the internal connection electrodes. A method of manufacturing the solar cell 110 is not particularly limited.

In the third step S130, the second composition containing a filling material selected from EVA (ethylene-vinyl acetate copolymer), silicone resin, PVB (polyvinyl butyral), etc. may be applied on the solar cell 110, and the lower cover 120b may be disposed thereon.

In the fourth step S140, the stack of the upper cover 120a, the light-conversion coating layer 130, the first filling material composition layer, the solar cell 110, the second filling material composition layer and the lower cover 120b as prepared through the first to third steps may be pressed at a preset temperature. Thus, the first filling material layer 140a and the second filling material layer 140b may be formed.

According to the solar cell module manufacturing method according to the present disclosure, the solar cell module may be manufactured using a process almost similar to a general process for manufacturing a solar cell module. Thus, the solar cell module according to the present disclosure may be manufactured using an existing solar cell module production line. The upconversion nano-particles may be applied to an entire inner face of the upper cover across a large area.

Hereinafter, examples and experimental examples of the present disclosure will be described in detail. However, the following examples are only some embodiments of the present disclosure, and the scope of the present disclosure is not limited to the following examples.

[Preparation of Upconversion Nano-Particles]

1.0 mmol of $RE_2O_3$ ($RE=Yb+Tm^3$) was mixed with 20 mL of 50% trifluoroacetic acid and the mixture was heated at 95° C. for 1 hour until $RE_2O_3$ was completely dissolved. Thus, the heated first mixed solution was obtained. The first mixed solution was mixed with 16 mL oleic acid, 16 mL oleylamine, 24 mL octadecene and 4 mmol trifluoroacetic acid. The mixed solution was heated for 45 minutes under an argon atmosphere at 120° C. and then was heat-treated to 300° C. for 15 minutes, thereby obtaining nano-particles having a composition $\alpha\text{-NaYbF}_4:Tm^{3+}$.

The $\alpha\text{-NaYbF}_4:Tm^{3+}$ was mixed with 20 mL of oleic acid, 20 mL of octadecene, and 2 mmol of sodium trifluoride acetate at a concentration of 2 mmol, and the mixture was then heated at 120° C. for 45 minutes to remove water and oxygen therefrom. A brown-colored solution was heated to 320° C. for 16 minutes in an argon atmosphere, and then was heat-treated for 30 minutes to obtain upconversion nano-particles having a $\beta\text{-NaYbF}_4:Tm^{3+}$ composition.

Present Examples 1, 2, and 3

A light-conversion coating layer obtained by mixing the upconversion nano-particles and the photoresist in a mass ratio of each of 1:5 (Present Example 1), 1:10 (Present Example 2), and 1:20 (Present Example 3) was formed on one face of a tempered glass upper cover. A first EVA filling material layer was formed thereon. Subsequently, a silicon solar cell having an area of 1 cm×1 cm was placed on the first EVA filling material layer. Then, a second EVA filling material layer was formed thereon. Then, a lower cover was placed thereon. Then, the stack structure was pressed and laminated to manufacture each solar cell module of each of Present Examples 1 to 3.

Experimental Example

FIG. 3 is a graph of an intensity based on a wavelength of light emission after irradiating a near-infrared wavelength to upconversion nano-particles having a $\beta\text{-NaYbF}_4:Tm^{3+}$ composition.

Referring to FIG. 3, it may be identified that the upconversion nano-particles having the $\beta\text{-NaYbF}_4:Tm^{3+}$ composition absorb near-infrared rays and then emit visible light with wavelengths of about 350 nm, and about 450 nm to 490 nm.

Solar cell modules of Comparative Examples 1 to 3 were prepared in the same manner as the process of manufacturing the solar cell modules of Examples 1, 2, and 3 except that the light-conversion coating layer was not provided. Table 1 below shows results of measuring an open-circuit voltage Voc, a short-circuit current Isc and a maximum output power Pmax of each of the solar cell modules of Present Examples 1, 2, and 3 and Comparative Examples 1 to 3.

TABLE 1

| UC nano-particles: photoresist | Voc (V) | Isc (mA) | Pmax (mW) | Pmax diff. (%) |
|---|---|---|---|---|
| 1:20 (Comparative Example 3) | 0.533 | 76.49 | 14.52 | 0.227 |
| 1:20 (Present Example 3) | 0.536 | 77.39 | 14.55 | 0.227 |
| 1:10 (Comparative Example 2) | 0.580 | 68.12 | 13.03 | 0.767 |
| 1:10 (Present Example 2) | 0.581 | 68.26 | 13.13 | 0.767 |
| 1:5 (Comparative Example 1) | 0.576 | 72.83 | 14.14 | 0.973 |
| 1:5 (Present Example 1) | 0.575 | 73.52 | 14.28 | 0.973 |

Referring to Table 1, it may be identified that each of the solar cell modules of Present Examples 1, 2, and 3 having the light-conversion coating layer has increased Pmax, compared to the solar cell modules of Comparative Examples 1, 2, and 3 not having the light-conversion coating layer.

Specifically, the solar cell module of Present Example 3 had increased Pmax by about 0.227% compared to that of the solar cell module of Comparative Example 3. The solar cell module of Present Example 2 had increased Pmax by about 0.767% compared to that of the solar cell module of Comparative Example 2. The solar cell module of Present Example 1 had increased Pmax by about 0.973% compared to that of the solar cell module of Comparative Example 1. The open-circuit voltages Voc of the solar cell modules of Present Examples 1, 2, and 3 and the solar cell modules of Comparative Examples 1, 2, and 3 were similar to each other. However, the short-circuit current Isc of each of the solar cell modules of Present Examples 1, 2, and 3 increased compared to that of each of the solar cell modules of Comparative Examples 1, 2, and 3. The increase in Pmax is interpreted as being due to the increase in the short-circuit current Isc.

The higher the content of the upconversion nano-particles contained in the light-conversion coating layer, the larger the increase in the Pmax value. It is interpreted that this is because an amount of visible light supplied to the silicon solar cell is increased due to the increase in an amount by which infrared light is converted into visible light via the upconversion nanoparticles.

Specifically, when the mixing ratio of the upconversion nano-particles and the photoresist was changed from 1:20 to 1:10, the Pmax greatly increased from 0.227% to 0.767%. However, when the mixing ratio of the upconversion nano-particles and the photoresist was changed from 1:10 to 1:5, the Pmax greatly increased from 0.767% to 0.973%. In consideration of the above fact, the content of the upconversion nano-particles is preferably about 10% or larger, for example, about 9 to 16.5%.

Although the embodiments of the present disclosure have been described in more detail with reference to the accompanying drawings, the present disclosure is not necessarily limited to these embodiments. The present disclosure may be implemented in various modified manners within the scope not departing from the technical idea of the present disclosure. Accordingly, the embodiments disclosed in the present disclosure are not intended to limit the technical idea of the present disclosure, but to describe the present disclosure. the scope of the technical idea of the present disclosure is not limited by the embodiments. Therefore, it should be understood that the embodiments as described above are illustrative and non-limiting in all respects. The scope of protection of the present disclosure should be interpreted by the claims, and all technical ideas within the scope of the present disclosure should be interpreted as being included in the scope of the present disclosure.

The invention claimed is:

1. A solar cell module, comprising:
   a solar cell including unit battery cells electrically connected to each other via connection electrodes;
   an upper cover disposed on a front face of the solar cell;
   a light-conversion coating layer coated on an inner face of the upper cover and comprising a transparent matrix layer and upconversion nano-particles for absorbing near-infrared rays and emitting light having a wavelength in a visible region;
   a lower cover disposed on a rear face of the solar cell;
   a first filling material layer formed between the solar cell and the light-conversion coating layer; and
   a second filling material layer formed between the solar cell and the lower cover,
   wherein the upconversion nano-particles comprising $NaYF_4$ doped with ytterbium (Yb) and erbium (Er) are dispersed in a material including a photoresist of the transparent matrix layer,
   wherein a mass ratio of the upconversion nano-particles comprising $NaYF_4$, Yb and Er to the material including the photoresist of the transparent matrix layer is greater than 1:10 and less than 1.5, and
   wherein the first and second filling material layers are formed to directly contact front and rear surfaces of the solar cell, respectively.

2. The solar cell module of claim 1, wherein the upconversion nano-particles absorb the near-infrared rays and emit visible light having a wavelength in a range of 350 to 500 nm.

3. The solar cell module of claim 1, wherein the light-conversion coating layer has a thickness in a range of 500 μm to 3 mm.

4. A solar cell module, comprising:
   a substrate;
   a transparent matrix layer formed on one face of the substrate;
   upconversion nano-particles dispersed in the transparent matrix layer;
   a first filling material layer formed under the transparent matrix layer comprising the upconversion nano-particles;
   a solar cell including unit battery cells electrically connected to each other via connection electrodes; and
   a second filling material layer formed under the solar cell,
   wherein the upconversion nano-particles comprising $NaYF_4$ doped with ytterbium (Yb) and erbium (Er) are dispersed in a material including a photoresist of the transparent matrix layer,
   wherein a mass ratio of the upconversion nano-particles comprising $NaYF_4$, Yb and Er to the material including the photoresist of the transparent matrix layer is greater than 1:10 and less than 1.5, and
   wherein each of the first and second filling material layers comprises EVA (ethylene-vinyl acetate copolymer), silicone resin, or PVB (polyvinyl butyral).

5. The solar cell module of claim 4, wherein the upconversion nano-particles absorb near-infrared rays and emit visible light having a wavelength in a range of 350 to 500 nm.

6. The solar cell module of claim 4, wherein the substrate comprises glass.

7. The solar cell module of claim 1, wherein each of the first and second filling material layers comprises EVA (ethylene-vinyl acetate copolymer), silicone resin, or PVB (polyvinyl butyral).

8. The solar cell module of claim 4, wherein the first and second filling material layers are formed to directly contact front and rear surfaces of the solar cell, respectively.

9. The solar cell module of claim 1, wherein the light-conversion coating layer further comprises cyclopentanone, and
   wherein a solid content of a mixed composition constituting the light-conversion coating layer is adjusted based on the cyclopentanone and ranges from 50 to 80 wt. %.

10. The solar cell module of claim 4, wherein the light-conversion coating layer further comprises cyclopentanone, and
    wherein a solid content of a mixed composition constituting a light-conversion coating layer comprising the transparent matrix layer and the upconversion nano-particles is adjusted based on the cyclopentanone and ranges from 50 to 80 wt. %.

* * * * *